United States Patent [19]
Ju et al.

[11] Patent Number: 5,814,528
[45] Date of Patent: Sep. 29, 1998

[54] FABRICATION METHOD OF SEMICONDUCTOR TEST PIECE

[75] Inventors: Byeong Kwon Ju; Myung Hwan Oh; Yun Hi Lee, all of Seoul; Nam Yang Lee, Seongnam; Keun Ha Koh, Seoul; Dong Ky Shin, Kyungsangbook-Do, all of Rep. of Korea

[73] Assignee: Korea Intstitute of Science and Technology, Seoul, Rep. of Korea

[21] Appl. No.: 729,064

[22] Filed: Oct. 10, 1996

[30] Foreign Application Priority Data

May 31, 1996 [KR] Rep. of Korea .................. 1996/19185

[51] Int. Cl.⁶ .......................... H01L 21/02; H01L 21/304
[52] U.S. Cl. ................................ 438/16; 438/692; 216/60
[58] Field of Search .......................... 216/59, 60; 438/692, 438/16, 101

[56] References Cited

PUBLICATIONS

"Structural Evaluation of Silicon–On–Insulation Fabricated By A Direct Wafer Bonding And Numerically Controlled Polishing Technique"; J. Elect. Soc., vol. 138, No. 8, pp. 2468–2474; Yamada et. al.; Aug. 1991.

"Recent Advances In Thinning of Bonded So I Wafers by Plasma Assited Chemical Etching"; Mumola et al.; Proceedings of The Third Internation Symposium on Semiconductor Wafer Bonding: Physics and Applications, Abstract Only (p. 28).

Yun, et al., "Studies on Microvoids at the Interface of Direct Bonded Silicon Wafers," *J. Electrochem. Soc.,* 139:2326–2330 (Aug., 1992).

*Primary Examiner*—R. Bruce Breneman
*Assistant Examiner*—George Goudreau
*Attorney, Agent, or Firm*—Townsend and Townsend and Crew, LLP

[57] ABSTRACT

A fabrication method for a test piece for observing non-contact regions in a pair of bonded semiconductor substrates includes thinning one substrate of a pair of bonded semiconductor substrates, grade-polishing the thinned semiconductor substrate and the bonded semiconductor substrates to have a predetermined graded angle relative their bonded surfaces, and dry-etching an area around the bonded surfaces of the grade-polished semiconductor substrates to reveal faults. With the thusly fabricated test piece, micro non-contact regions can be simply observed and crystal faults existing on the bonded surfaces as well as in the micro non-contact regions can be easily detected.

4 Claims, 4 Drawing Sheets

FABRICATION METHOD OF SEMICONDUCTOR TEST PIECE

BACKGROUND OF THE INVENTION

1. Field of the Invention

The present invention relates to semiconductor testing, and more particularly, a fabrication method for test pieces for observing non-contact regions in a pair of bonded semiconductor substrates.

2. Description of the Conventional Art

In a pair of semiconductor substrates bonded through an anodic bonding or direct bonding, by observing non-contact regions, it is possible to analyze the mechanism of their generations or the degree of their transformation. So far, studies have been conducted concerning macro non-contact regions which have an observable width of a few mm to a few cm FIG. 1 shows such a non-contact region 2, which is generated between a pair of bonded semiconductor substrates 1 in FIG. 1A and which has a width and height as shown in cross-section FIG. 1B taken along line A—A in FIG. 1A.

Methods for observing the non-contact regions of the pair of the semiconductor substrates include using an IR image (infrared image), using ultrasound microscopy, using X-ray topography and using a magic mirror. The above methods will now be briefly described.

First, the methods using the IR image device, the ultrasound microscopy and the X-ray topography are those for observing and analyzing the bonded surfaces by observing and analyzing such reflected infrared rays, ultrasound or X-rays. The IR image device and the ultrasound microscopy can be used simply and easily. In particular, the IR image device can measure in real time and the X-ray topography can excellently perform a function of disintegration.

According to the method using the magic mirror, a convex surface appears black due to dust particles or gases being trapped at the interface during the bonding process, and the rest appears light. Therefore, it is easy to distinguish the surface faults, in comparison with the methods using of infrared rays, ultrasound or X-rays.

Of the above mentioned methods for observing the pair of bonded semiconductor substrates, in the case of the IR image device, when the height of the non-contact region is below $\lambda/4$ ($\lambda$ is a wave length of IR), since no Newton ring representing non-contact regions appears, it is impossible to measure the non-contact region, resulting in a much limited observation region, and in addition it is difficult to observe non-contact regions having a width below few mm. In the case of using ultrasound microscopy, it is impossible to precisely observe non-contact regions having a width below 1 mm. Finally, in the case of X-ray topography, the width of non-contact region observable is limited to more than tens of $\mu$m. The above described methods using ultrasound microscopy and X-ray topography are high cost and require much time. In addition, the method using the magic mirror has an uncertain capability for disintegration.

That is, the conventional methods for observing the non-contact regions in a pair of the bonded semiconductor substrates are difficult to adapt to micro non-contact regions having a small size and width.

SUMMARY OF THE INVENTION

Accordingly, it is an object of the present invention to provide an improved fabrication method for test pieces used for observing non-contact regions in a pair of bonded semiconductor substrates which is capable of observing not only micro non-contact regions having a width below 10 $\mu$m, but also imperfect crystal faults existing on the bonded surfaces.

To achieve the above object, there is provided an improved fabrication method of test pieces used for observing non-contact regions in a pair of bonded semiconductor substrates according to the present invention which includes thinning one substrate of a pair of upper and lower bonded semiconductor substrates, grade-polishing the thinned semiconductor substrate and the bonded semiconductor substrates so that they may have a predetermined graded angle against the bonded surfaces, and dry-etching the area around the bonded surfaces of the grade-polished upper and lower semiconductor substrates to observe the shape or size of the faults on an etching pattern.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Referring to accompanying drawings, the preferred embodiments of the present invention will be described in detail.

Figure 1A:
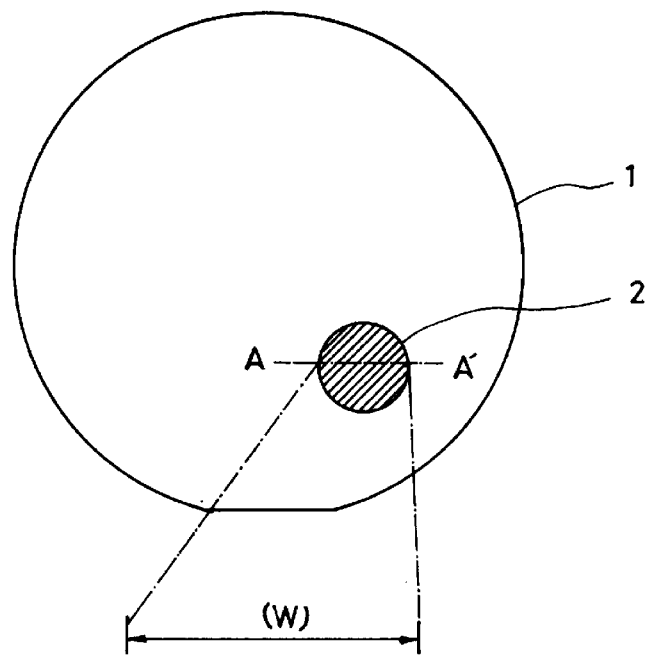
FIGS. 1A and 1B are views showing a pair of bonded semiconductor substrates.
Figure 1B:
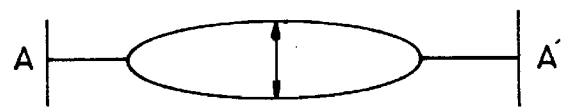
Figure 2:
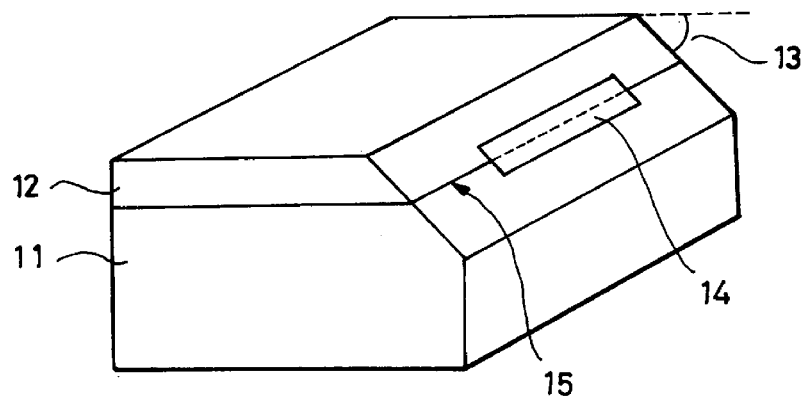
FIG. 2 is a view showing a construction of a test piece used for observing non-contact regions in a pair of bonded semiconductor substrates according to the present invention.

As shown in FIG. 2, a pair of bonded semiconductor substrates 11,12 are mechanically polished and thinned, so that one substrate 12 is left to have a thickness of 3 to 15 $\mu$m and to have a small graded angle 13 of 1°9 to 5° with respect to the horizontal surface.

Figure 3:
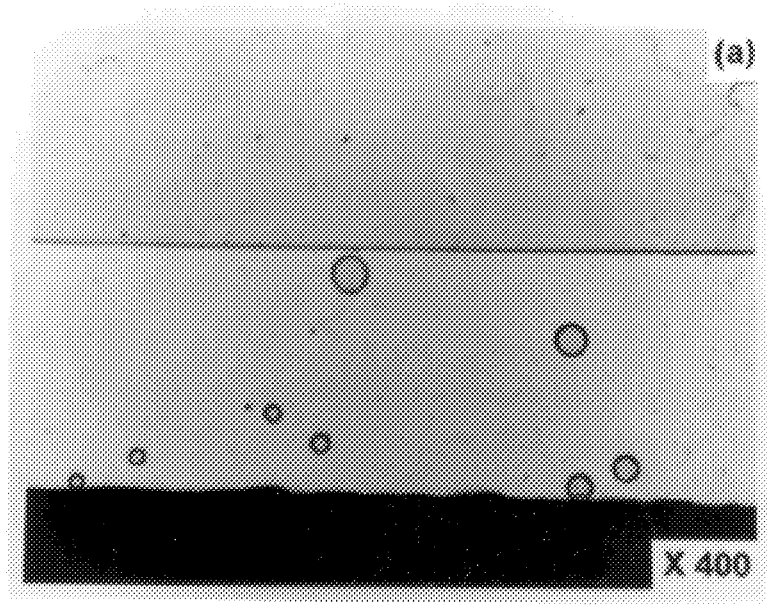
FIG. 3 is a microphotograph showing the actual shape of micro non-contact regions in a pair of bonded semiconductor substrates fabricated after the process of thinning and grade-polishing according to the present invention.

As shown in FIG. 3, through the grade-polishing, micro non-contact regions having a width of a few $\mu$m and a height of below 1 $\mu$m can be observed through a microscope.

Next, so that crystal faults generated around the bonded surfaces may be represented with the non-contact regions on an etching pattern, a mirror polishing is performed on the grade-polished surface by using alumina powder particles having a size of 0.05 µm, and the test piece is put in a dry-etching solution for revealing the faults on the etching pattern such as a Wright solution, Sirtle solution, a Dash solution or a Secco solution which can etch a semiconductor at a predetermined rate and reveal crystal faults on the etching pattern and an observation region 14 is observed.

Here, the Wright solution is composed of 60 ml of HF, 30 ml of $HNO_3$, 30 ml of $CrO_3$(5 mole %), 2 g of $Cu(NO_3)_2/3H_2O$, 60 ml of $H_2O$, and 60 ml of $CH_3COOH$, and performs an etching in the direction of the 100-oriented surface at a speed of 1 µm per minute and in addition, selectively performs an etching in the direction of the 100-oriented surface and reveals the faults such as a dislocation, an oxidation stacking fault(OSF), swirl and stir on the etching pattern.

And, the Sirtle solution is composed of 10 ml of HF, 50 g of $CrO_3$ and 100 ml of $H_2O$, and performs an etching in the direction of the 111-oriented surface at a speed of about 3.5 µm per minute. The Dash solution is composed of 10 ml of HF, 30 ml of $HNO_3$ and 120 ml of $CH_3COOH$, and performs an etching in the direction of the 100-oriented surface at a speed of about 0.1 µm per minute. And, the Secco solution is composed of 100 ml of HF, 50 ml of $K_2Cr_2O_7$(0.15 mol %), and performs an etching in the direction of the 100-oriented surface at a speed of about 1.5 µm per minute.

Figure 4:
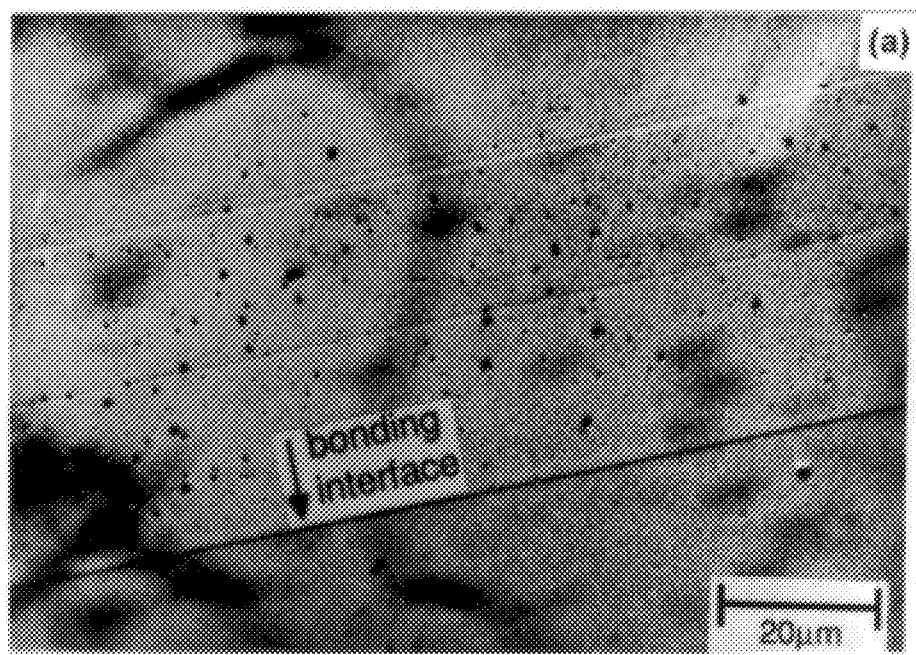
FIG. 4 is a microphotograph showing the actual shape of crystal faults around the bonded surfaces of a pair of bonded semiconductor substrates fabricated after the process of thinning, grade-polishing and dry-etching according to the present invention.

FIG. 4 is a view showing the actual shapes of crystal faults around the bonded surfaces 15 of a pair of bonded semiconductor substrates observed through a microscope after a test piece formed of a pair of the semiconductor substrates annealed for 30 minutes at a temperature of 1100° C. and etched for a predetermined time in the Wright solution, one of the etching solutions for revealing faults on the etching pattern. Crystal faults 16 can be seen to be concentrated as a dislocation only on the thinned semiconductor substrates 12 around the bonded surfaces 15, and the thickness of the region in which the crystal faults 16 exist is about 2.1 µm away from the bonded surfaces. When observed in the microphotograph, it is 4.2 cm thick, which is a figure amounting to 1/sin 2° 52'×1000 to 20,000 times.

Figure 5:
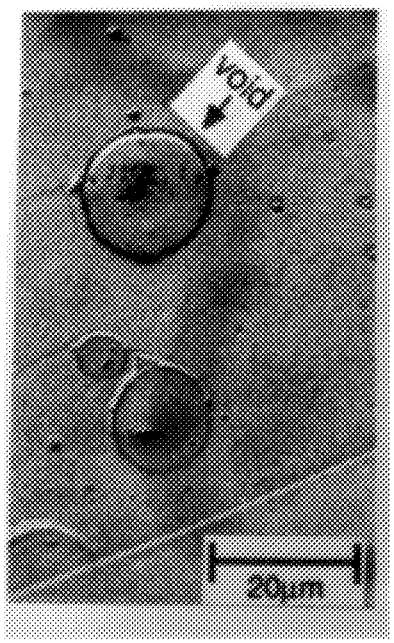
FIG. 5 is a microphotograph showing the actual shape of non-contact regions of a pair of bonded semiconductor substrates fabricated after the process of thinning, grade-polishing, and dry-etching according to the present invention.
Figure 6A:
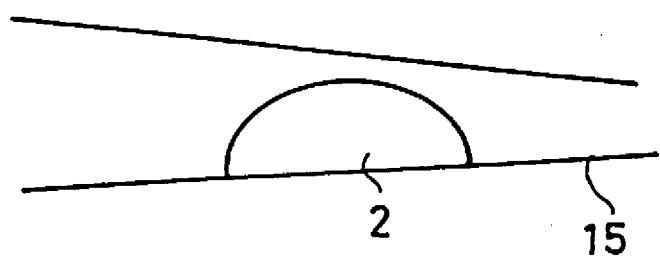
FIG. 6A and 6B are cross-sectional views showing the shape of non-contact regions before and after the dry-etching according to the present invention.
Figure 6B:
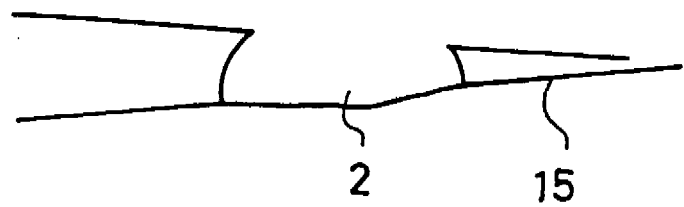

As shown in FIG. 5, a non-contact region 2 having a width below 20 µm can be observed, and as shown in FIG. 6, a predetermined portion of the non-contact region 2 thinned through a grade-polishing(FIG. 6A) is revealed as the Wright solution etches the silicon(FIG. 6B). The test pieces thusly fabricated through the thinning, grade-polishing and dry-etching can be adapted to the observation of the bonding structure of semiconductors such as semiconductor-insulating film-semiconductor as well as the bonding of a pair of semiconductor substrates.

As described above, the test piece according to the present invention has the effect that the crystal faults existing on the bonded surfaces as well as in the micro non-contact regions can be easily detected.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed:

1. A fabrication method of a test piece for observing non-contact regions in a pair of bonded semiconductor substrates, comprising:

thinning one substrate of a pair of bonded semiconductor substrates;

grade-polishing the thinned semiconductor substrate and the bonded semiconductor substrates to have a predetermined graded angle relative their bonded surfaces; and dry-etching an area around the bonded surfaces of the grade-polished semiconductor substrates to reveal faults on the etching pattern.

2. The fabrication method of claim 1, wherein said thinned semiconductor substrate is formed to be about 3 µm thick.

3. The fabrication method of claim 1, wherein said graded polishing process includes a mirror polishing of the etching surface by using a fine powder after grade-polishing.

4. The fabrication method of claim 1, wherein said grade-angle is below 5°.

* * * * *